United States Patent
Yen et al.

(10) Patent No.: US 9,723,752 B2
(45) Date of Patent: Aug. 1, 2017

(54) HEAT DISSIPATING SYSTEM

(71) Applicants: Chang-Hsu Yen, Taipei (TW);
Chien-Yu Lin, Taipei (TW)

(72) Inventors: Chang-Hsu Yen, Taipei (TW);
Chien-Yu Lin, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 415 days.

(21) Appl. No.: 14/277,807

(22) Filed: May 15, 2014

(65) Prior Publication Data
US 2014/0338868 A1    Nov. 20, 2014

(30) Foreign Application Priority Data

May 16, 2013    (TW) .............................. 102117397 A

(51) Int. Cl.
*H05K 7/20* (2006.01)
*F04B 43/04* (2006.01)
*F04B 45/047* (2006.01)
*F04F 7/00* (2006.01)

(52) U.S. Cl.
CPC ....... *H05K 7/20172* (2013.01); *F04B 43/046* (2013.01); *F04B 45/047* (2013.01); *F04F 7/00* (2013.01)

(58) Field of Classification Search
CPC ........... H05K 7/20145; H05K 7/20316; H05K 7/20009; H05K 7/20136; H05K 7/20172; G06F 1/203; F04F 7/00; F04B 45/047; F04B 43/046
USPC ........................................................ 361/692
See application file for complete search history.

(56) References Cited

U.S. PATENT DOCUMENTS

| | | | | |
|---|---|---|---|---|
| 6,501,649 B2* | 12/2002 | Yanes | ...................... | H02B 1/28 165/80.3 |
| 7,251,139 B2* | 7/2007 | Bhattacharya | ..... | H05K 7/20009 165/104.33 |
| 7,957,140 B2* | 6/2011 | Mongia | ................... | G06F 1/203 165/104.33 |
| 8,342,819 B2* | 1/2013 | Arik | ........................ | H01L 23/40 239/102.2 |
| 2005/0013116 A1* | 1/2005 | Pokharna | ................ | G06F 1/203 361/695 |
| 2007/0127210 A1* | 6/2007 | Mahalingam | ............. | G06F 1/20 361/700 |
| 2011/0168361 A1 | 7/2011 | Chao et al. | | |

FOREIGN PATENT DOCUMENTS

| | | |
|---|---|---|
| CN | 2800358 | 7/2006 |
| CN | 201414274 Y | 2/2010 |
| CN | 101881285 A | 11/2010 |
| TW | 201125479 | 7/2011 |

* cited by examiner

Primary Examiner — Tho V Duong
(74) Attorney, Agent, or Firm — Jianq Chyun IP Office

(57) ABSTRACT

A heat dissipating system including a casing body, a heat source and a piezoelectric fan is provided. The casing body includes an upper casing and a bottom case, wherein at least one of the upper casing and the bottom casing includes at least one air inlet. The heat source and the piezoelectric fan are both disposed in the casing body. The piezoelectric fan has an opening facing the heat source while the air inlet is adjacent to the opening. Air is adsorbed into the opening through the air inlet and is exhausted out towards a direction of the heat source by the piezoelectric fan.

7 Claims, 6 Drawing Sheets

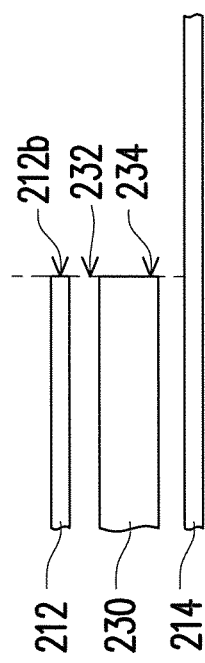
FIG. 6.1
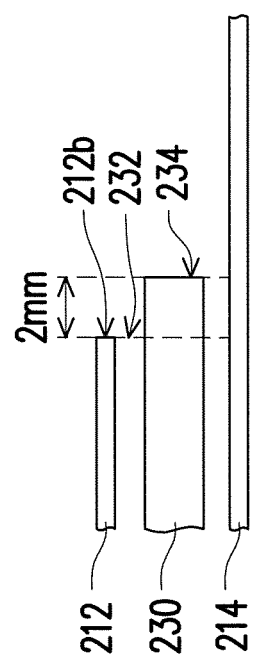
FIG. 6.2
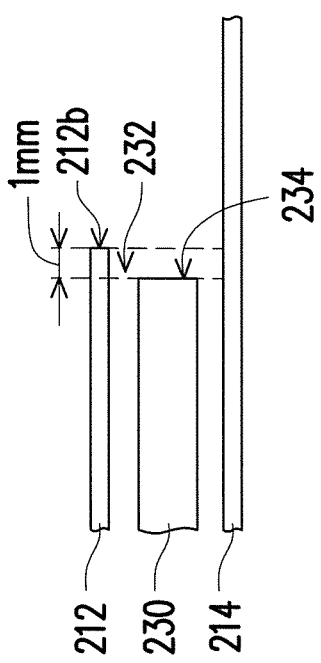
FIG. 6.3

HEAT DISSIPATING SYSTEM

CROSS-REFERENCE TO RELATED APPLICATION

This application claims the priority benefit of TW application serial No. 102117397, filed on May 16, 2013. The entirety of the above-mentioned patent application is hereby incorporated by reference herein and made a part of specification.

BACKGROUND OF THE INVENTION

Field of the Invention

The invention is relates to a heat dissipating system and, more particularly, to a heat dissipating system for an electronic device.

Description of the Related Art

As the electronic device becomes thinner and lighter, an active heat dissipating system is used to the electronic device to improve the CPU efficiency to avoid the electronic device overheated. However, a conventional fan with blades is difficult to be adapted to the thinner electronic product. Thus, fans with vibrating membranes using piezoelectric materials or electromagnetic induction instead of blades are developed.

In a conventional heat dissipating system, piezoelectric materials swings and vibrates in an enclosed space to generate airflow to cool down the components in the system, which is efficient for dissipating heat in a hot spot. However, since the heat dissipating system is sealed, the whole environment temperature in the system continuously increases with the time, the hot air cannot be exhausted out and the cool air cannot be adsorbed in, therefore, the heat dissipating efficiency of the system becomes lower.

FIG. 1 is a schematic diagram showing a conventional heat dissipating system. As shown in FIG. 1, an opening 124 is formed at a side wall 122 of a casing body 120, and a piezoelectric fan 110 is fixed at the side wall 122. In and embodiment, the opening 124 is corresponding to the piezoelectric fan 110, and the cool air outside of the casing body 120 can be drawing into the casing body 120 through the opening 124 of the side wall 122 to decrease the environment temperature in the system. However, air drew and exhausted are only through the opening 124 of the side wall 122, the exhausted hot air may be re-drew back into the casing body 120 instantly due to the change of the state of the piezoelectric fan 110, which decreases the efficiency of the heat dissipating system 100.

BRIEF SUMMARY OF THE INVENTION

A heat dissipating system having good heat dissipation efficiency is provided.

The heat dissipating system includes a casing body, a heat source and a piezoelectric fan. The casing body includes an upper casing and a bottom casing. At least one of the upper casing and the bottom casing includes at least one air inlet. The heat source and the piezoelectric fan are both disposed in the casing body. The piezoelectric fan has an opening facing the heat source while the air inlet is adjacent to the opening. Air is drawn into the opening through the air inlet and is exhausted out towards a direction of the heat source by the piezoelectric fan.

Base on the descriptions above, in the heat dissipating system, the air inlet and the air outlet of the piezoelectric fan will not interfere with each other by means of appropriately opening on the casing body in the heat dissipating system, which can reduce the turbulence of the flow and increase the cooling effect.

BRIEF DESCRIPTION OF THE DRAWINGS

FIG. 6.1 to FIG. 6.3 are schematic diagrams showing relationships between the inlet position and the piezoelectric fan in FIG. 5.

DETAILED DESCRIPTION OF THE EMBODIMENTS

Figure 1:
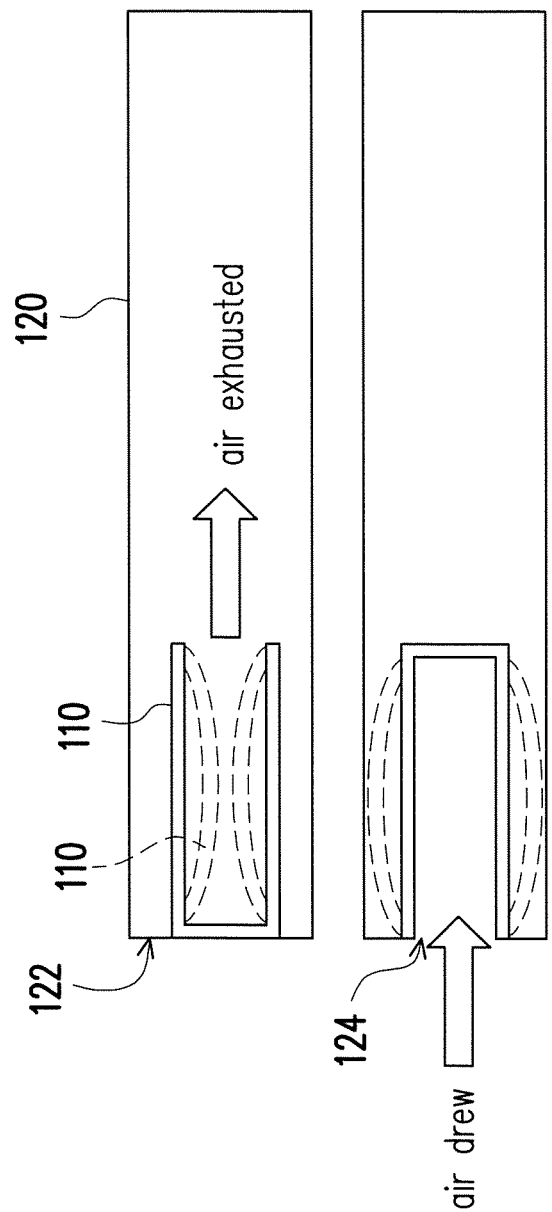
FIG. 1 is a schematic diagram showing a conventional heat dissipating system.
Figure 2:
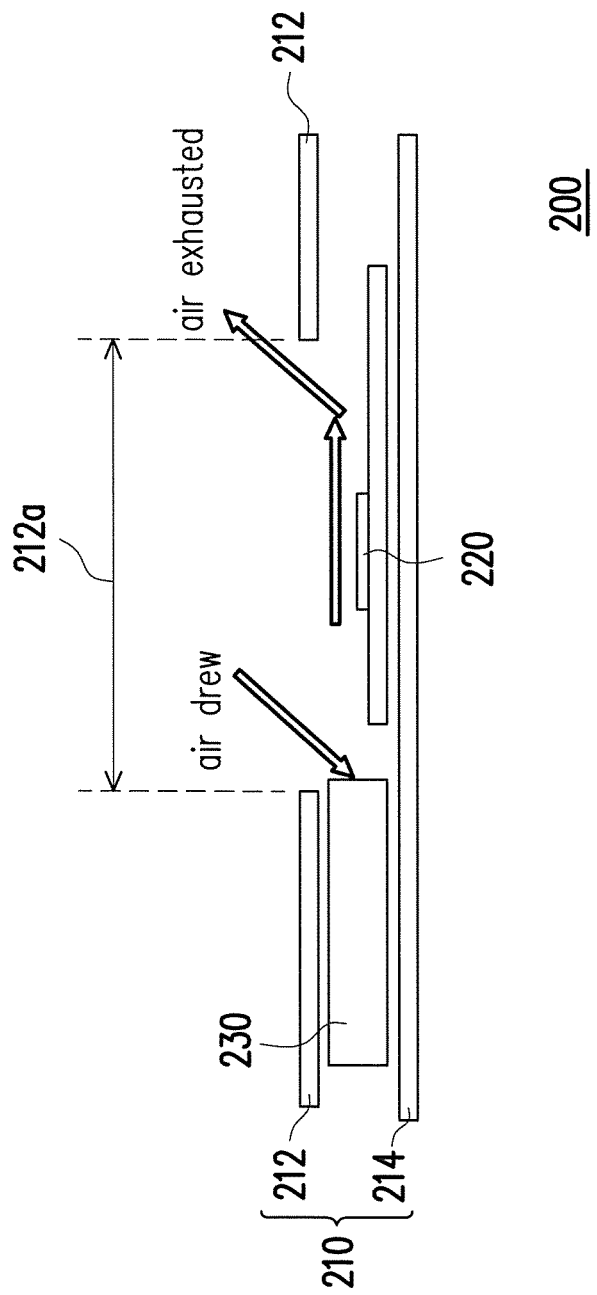
FIG. 2 is a schematic diagram showing a heat dissipating system in an embodiment.

FIG. 2 is a schematic diagram showing a heat dissipating system in an embodiment. As shown in FIG. 2, the heat dissipating system 200 includes a casing body 210, a heat source 220 and a piezoelectric fan 230. The material of the casing body 210 may be plastic which is not limited herein. The casing body 210 has an upper casing 212 and a bottom casing 214. In the embodiment, the upper casing 212 has an air inlet 212a. The heat source 220 and the piezoelectric fan 230 are both disposed in the casing body 210. The piezoelectric fan 230 has an opening 232 facing the piezoelectric fan 230, and the air inlet 212a is adjacent to the opening 232 of the piezoelectric fan 230.

Figure 3:
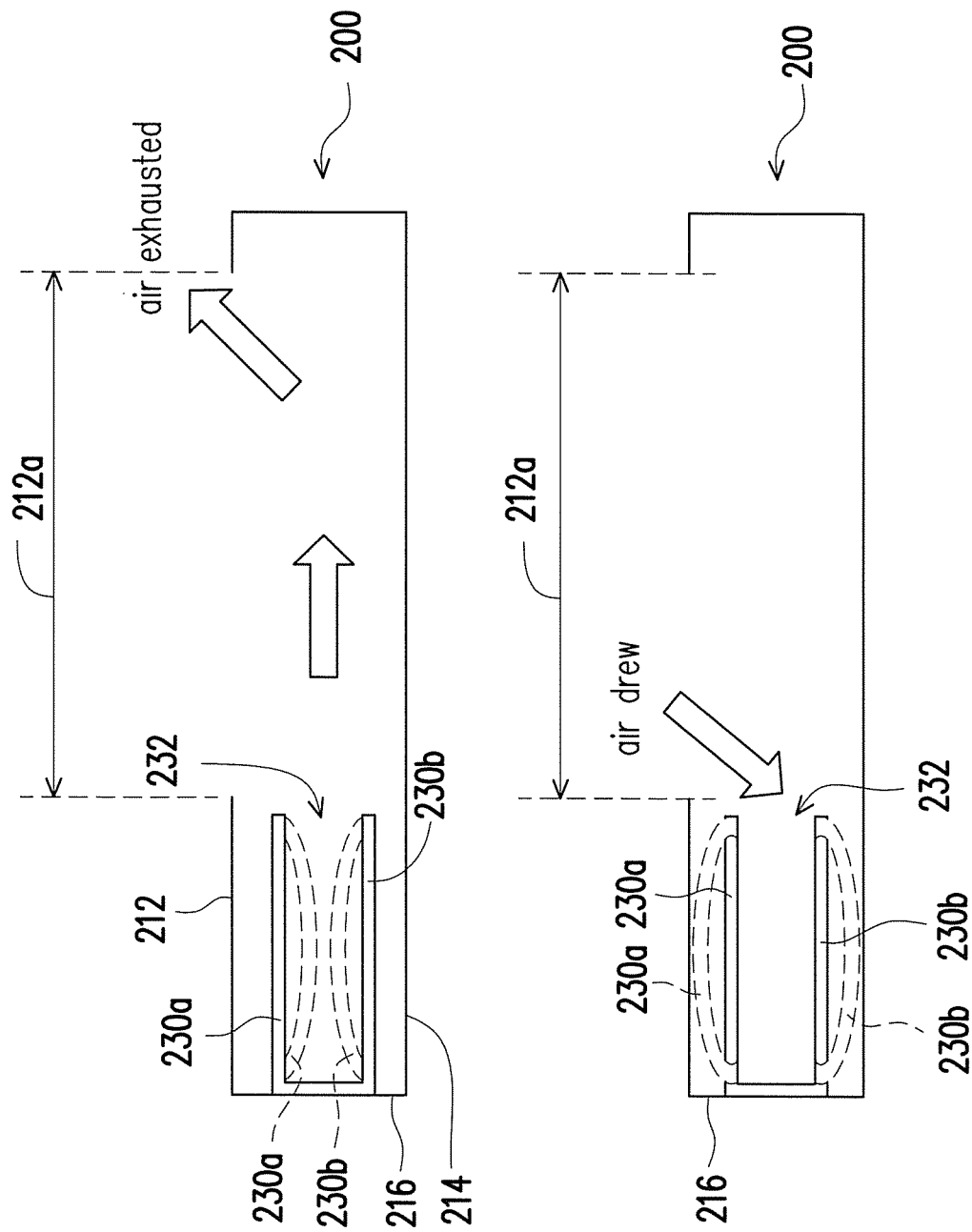
FIG. 3 is a schematic diagram showing that a piezoelectric fan of a heat dissipating system operates in an embodiment.

FIG. 3 is a schematic diagram showing that a piezoelectric fan of a heat dissipating system operates in an embodiment. As shown in FIG. 2 and FIG. 3, the casing body 210 has multiple side walls 261 surrounding the periphery of the upper casing 212 and the bottom casing 214. Furthermore, the heat source 220 faces the air inlet 212a. The aperture of the air inlet 212a is large to cover the heat source 220 under the air inlet 212a. The heat source 220 in the embodiment is an electronic component which can generate heat, such as a chip or a board with chips. The piezoelectric fan 230 may be formed by two piezoelectric materials 230a and 230b which has the orthographic projected images overlapped but do not contact each other physically. By means of supplying different electric fields to the piezoelectric fan 230, a direct piezoelectric effect and a converse piezoelectric effect are generated, which results for the two piezoelectric materials 230a and 230b of the piezoelectric fan 230 attract or repel, and then air can be drew in or exhausted out through the opening 232.

Specifically, when a first electric field provided to the piezoelectric fan 230 and transforms the two piezoelectric materials 230a, 230b towards each other, a pressure is formed by the transformation, and air flows forward from the opening 232 through the heat source 220 (that is, air flows towards the heat source 220). Then, air exhausts out of the heat dissipating system 200 from a side of the heat source 220 which is far from the piezoelectric fan 230 through the air inlet 212a. When a second electric field provided to the piezoelectric fan 230 and transforms the two piezoelectric materials 230a, 230b apart, the air is drew into the heat dissipating system 200 from a side of the heat source 220 which is close to the piezoelectric fan 230 through the air inlet 212a. With the alternating of a direct piezoelectric effect and a converse piezoelectric effect, the cool air can be drew into the heat dissipating system 200 from the outside of the heat dissipating system 200, and the hot air can exhaust out of the heat dissipating system 200 from the inside of the heat dissipating system 200.

Specifically speaking, the electric field provided to the piezoelectric fan 230 changes rapidly, and the adsorbing and the exhausting of air due to the direct piezoelectric effect and the converse piezoelectric effect are both though the opening 232 of the piezoelectric fan 230. If no air inlet 212a of the casing body 210 is formed adjacent to the opening 232 of the piezoelectric fan 230 correspondingly, the hot air exhausted by the piezoelectric fan 230 may be re-adsorbed in by the piezoelectric fan 230 and cannot be exhausted out of the system, as a result, the temperature in the whole heat dissipating system 200 would not be decreased, and the heat dissipation efficiency is poor.

In the embodiment, since an air inlet 212a with a large aperture is formed at the upper casing 212 of the casing body 210, the air exhausted from the piezoelectric fan 230 by the rapid change of the pressure can pass through the heat source 220 and then get out of a side of the air inlet 212a far from the piezoelectric fan 230 rapidly. When the electric field is changed to make air drawing in via the piezoelectric fan 230, air at a side of the air inlet 212a which is relatively close to the piezoelectric fan 230 will be drew in because of the short distance to the piezoelectric fan 230. Consequently, the heat dissipating system 200 can efficiently exhaust the hot air out of the casing body 210 and adsorb the cool air into the casing body 210, the heat dissipating system 200 has good heat dissipation efficiency.

Figure 4:
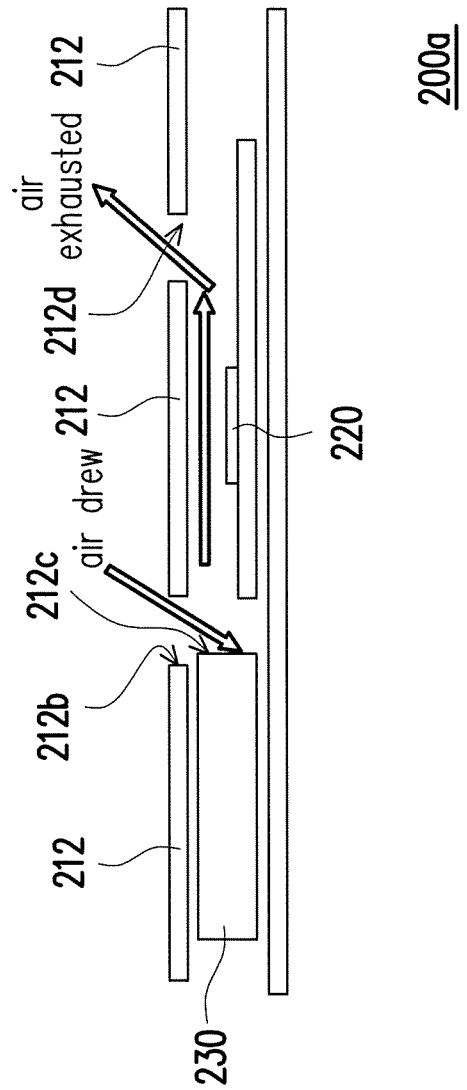
FIG. 4 is a schematic diagram showing a heat dissipating system in another embodiment.

FIG. 4 is a schematic diagram showing a heat dissipating system in another embodiment. As shown in FIG. 4, the same or similar components symbols denote the same or similar components. The differences between the embodiment and the above embodiment are that the aperture of the air inlet 212a is not big, an air outlet 212d is further formed at the casing body 210, and the heat source 220 is disposed between the air inlet 212c and the air outlet 212d (that is, the heat source 220 does not overlap the air inlet 212c in their orthographic projected images). Except that the air inlet 212c also needs be disposed adjacent to the opening 232, the distance between the air outlet 212d and the opening 232 is longer than the distance between the air inlet 212c and the opening 232, and an orthographic projected image of the air inlet 212c overlaps a part of that of the piezoelectric fan 230.

An orthographic projected image of the air inlet 212c is overlapping the part of that of the piezoelectric fan 230, which means that a first side 212b of the air inlet 212c is not aligned with a second side 234 of the piezoelectric fan 230 (as shown in FIG. 6.1) physically, and a second side 234 is located at the range of the air inlet 212c. As a result, that orthographic projected image of the air inlet 212c will overlap part of that of the piezoelectric fan 230. The operation of the piezoelectric fan 230 is described in the above embodiment, which is omitted herein. By disposing an air inlet 212c and an air outlet 212d at the opposite sides of the heat source 220 respectively, the interference between the inlet air and the outlet air of the heat dissipating system 200a is efficiently prevented, and the heat dissipation efficiency of the heat dissipating system 200a is improved.

The position of the air inlet 212c can be changed according to requirements. Since the position of the air inlet 212c is different, the distance of the air exhausted from the piezoelectric fan 230 is varies due to the interference of the air drawing in, which will be, further illustrated hereinafter.

Figure 5:
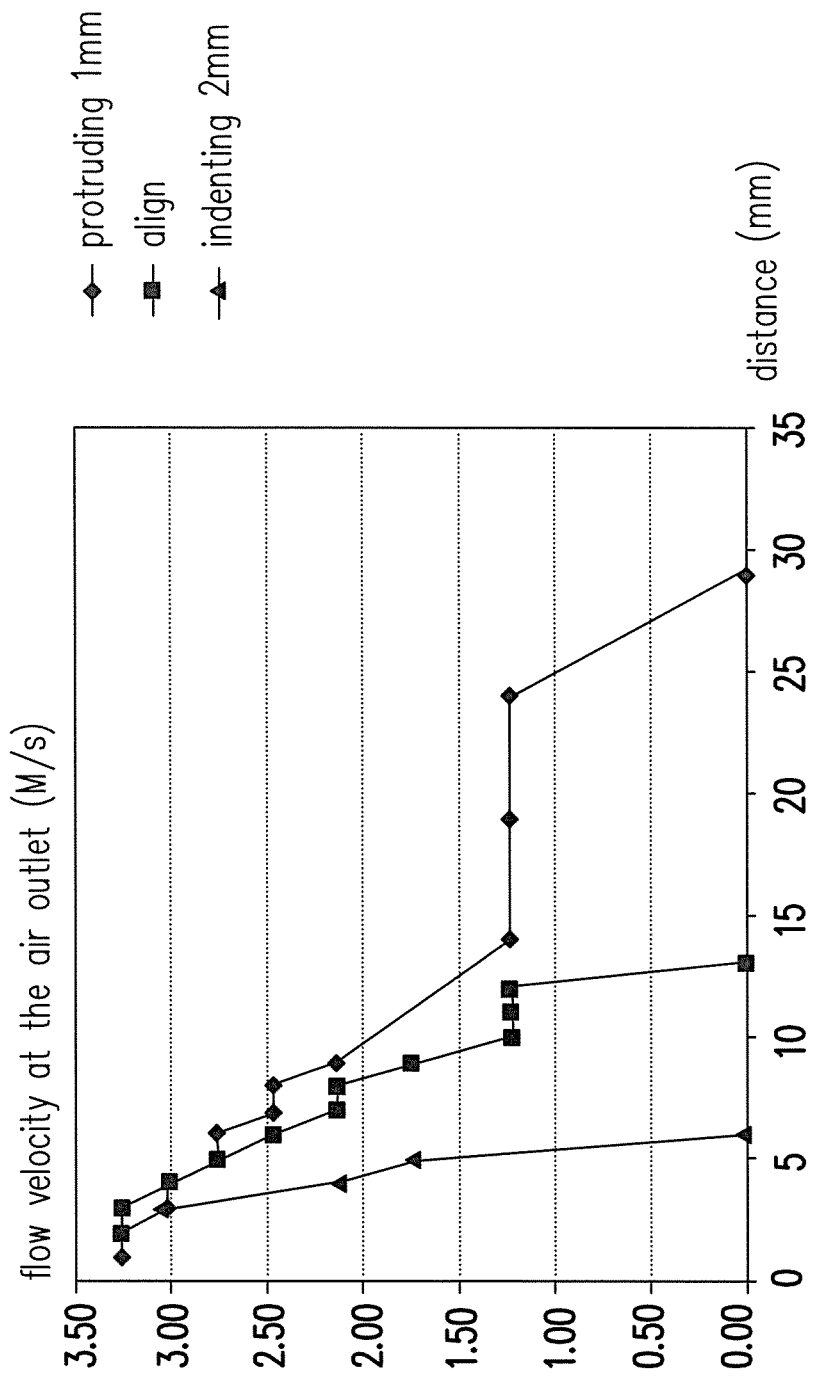
FIG. 5 is a schematic diagram showing relationships between the center wind velocity of the air exhausted by the piezoelectric fan and the distance.

FIG. 5 is a schematic diagram showing relationships between the center wind velocity of the air exhausted by the piezoelectric fan and the distance, FIG. 6.1 to FIG. 6.3 are schematic diagrams showing relationships between the inlet position and the piezoelectric fan in FIG. 5. As shown in FIG. 6.1, a first side 212b of the air inlet 212c is aligned with a second side 234 of the piezoelectric fan 230. As shown in FIG. 6.2, a second side 234 of the piezoelectric fan 230 is located at the range of the air inlet 212c (that is, the orthographic projected image of the air inlet 212c overlaps a part of that of the piezoelectric fan 230). As shown in FIG. 6.3, the second side 234 of the piezoelectric fan 230 is not located at the range of the air inlet 212c (that is, the piezoelectric fan 230 do not overlap the air inlet 212c in their orthographic projected images), and the upper casing 212 of the casing body 210 covers the top of the piezoelectric fan 230 and protrudes over the piezoelectric fan 230.

As shown in FIG. 5, when the second side 234 of the piezoelectric fan 230 protrudes over the first side 212b of the air inlet 212a about 1 mm, the distance of the air exhausted is about 30 mm; when the second side 234 of the piezoelectric fan 230 indented from the first side 212b of the air inlet 212a about 2 mm, the distance of the air exhausted is only about 6 mm; when the second side 234 of the piezoelectric fan 230 is aligned with the first side 212b of the air inlet 212a, the distance of the air exhausted is between 6 mm and 30 mm, more specifically, is about 13 mm. Therefore, the second side 234 of the piezoelectric fan 230 protruding over the first side 212b of the air inlet 212a decreases the interference that occurred while the air is drew in or exhausted out, and the heat dissipation efficiency is improved, which is not limited herein.

Although only the upper casing 212 having an air inlet 212a and the upper casing 212 having an air inlet 212c and an air outlet 212d are mentioned in the above embodiments, the air inlet 212a, 212c and the air outlet 212d also can be formed at the bottom casing 214, whether the positions of the air inlet 212a (or the air outlet 212d) at the upper casing 212 corresponds to that at the bottom casing 214 or not, can be changed according to the requirements, which is not limited herein.

In the heat dissipating system in embodiments, an air inlet and an air outlet are disposed at the casing body, and thus a piezoelectric fan efficiently exhausts the hot air out of the casing body, and transfers the cool air into the casing body, and improves the heat dissipation efficiency.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:
1. A heat dissipating system, comprising:
a casing body having an upper casing and a bottom casing, and at least one of the upper casing and the bottom casing includes at least one air inlet;
a heat source disposed in the casing body; and
a piezoelectric fan disposed in the casing body and having an opening, the opening faces the heat source, and the air inlet is adjacent to the opening, air draw into the opening through the air inlet, and exhaust out towards a direction to the heat source by the piezoelectric fan, wherein an orthographic projected image of the opening on the bottom casing is overlapped with an orthographic projected image of the air inlet on the bottom casing.

2. The heat dissipating system according to claim 1, wherein an orthographic projected image of the air inlet overlaps partially of that of the piezoelectric fan.

3. The heat dissipating system according to claim 1, wherein an orthographic projected image of the heat source overlaps that of the air inlet.

4. The heat dissipating system according to claim 1, wherein an orthographic projected image of the heat source does not overlap that of the air inlet.

5. The heat dissipating system according to claim 1, wherein at least one of the upper casing and the bottom casing has at least one air outlet, the distance between the air outlet and the opening is larger than the distance between the air inlet and the opening.

6. The heat dissipating system according to claim 5, wherein the heat source is between the air inlet and the air outlet.

7. The heat dissipating system according to claim 5, wherein both the upper casing and the bottom casing of the casing body have the air inlet and the air outlet.

* * * * *